United States Patent [19]

Brooks, Jr.

[11] Patent Number: 4,522,914

[45] Date of Patent: Jun. 11, 1985

[54] IMAGING METHOD OF MAKING A RAISED LINE FACSIMILE OF A PHOTOGRAPHIC IMAGE

[75] Inventor: Austin E. Brooks, Jr., Crawfordsville, Ind.

[73] Assignee: Wabash College, Crawfordsville, Ind.

[21] Appl. No.: 435,931

[22] Filed: Oct. 22, 1982

[51] Int. Cl.³ .......................... G03C 7/00; G03C 7/12
[52] U.S. Cl. .................................. 430/320; 430/308; 430/330
[58] Field of Search ............... 430/308, 175, 176, 320, 430/330

[56] References Cited

U.S. PATENT DOCUMENTS

| | | | |
|---|---|---|---|
| 3,246,598 | 4/1966 | Satonick | 430/308 |
| 3,853,561 | 12/1974 | Reichel et al. | 430/308 |
| 3,882,168 | 5/1975 | Klupfel et al. | 430/526 |
| 3,924,019 | 12/1975 | Jacob | 430/107 |
| 4,064,287 | 12/1977 | Lipson et al. | 430/308 |
| 4,065,524 | 12/1977 | Laridon et al. | 430/176 |
| 4,154,614 | 5/1979 | Tsunoda et al. | 430/308 |

*Primary Examiner*—Charles L. Bowers, Jr.
*Attorney, Agent, or Firm*—Darby & Darby

[57] ABSTRACT

One aspect of the present invention relates to a method for making a raised line facsimile of a graphic prototype suitable for use by visually handicapped individuals in lieu of said prototype. Another aspect of this invention relates to a raised line facsimile suitable for use by visually handicapped individuals prepared in accordance with the above method. A third aspect of this invention relates to an instruction supplement assembly for teaching visually handicapped students comprising a raised line facsimile as described in the preceding paragraph and an audiotape recording containing at least one of (a) instructions for use of said facsimile and (b) descriptive information pertaining thereto.

10 Claims, No Drawings

IMAGING METHOD OF MAKING A RAISED LINE FACSIMILE OF A PHOTOGRAPHIC IMAGE

BACKGROUND OF THE INVENTION

This invention relates to graphic laboratory supplements for use by the visually handicapped and to a process for making such supplements. More particularly, this invention[1] relates to raised-line or high-relief facsimiles of photographs, drawings, or enlarged photomicrographs suitable for use by visually handicapped students as laboratory supplements and instruction aids, and to a process for making such diagrams and facsimiles.

[1] Research leading to this invention was funded at least in part by National Science Foundation grant SED-8022031. The National Science Foundation has disclaimed responsibility for the activity conducted under this grant.

Currently, there are about half-a-million Americans that are "legally blind". A significant portion of these individuals could be served by taking a course such as a biology course, an integral part of which involves observation through a microscope. Those visually impaired students are likely to experience frustration and failure because present instruction methods lack adequate ways to present microscopic images to the non-sighted and therefore to convey concepts to them which are fully understandable only through microscopic observation. In addition, instruction methods for the visually impaired in other subjects such as mathematics, economics, physics, chemistry, geology, history, etc. (wherein use of photographs, diagrams and drawings simplifies instruction and improves understanding of students, as is commonplace when teaching the sighted) would be rendered more effective by devising a way to present such supplements to the visually handicapped student.

Some graphic supplements such as embossed drawings and diagrams, thermoformed or vacuum-formed three-dimensional facsimiles of maps and other articles and solid three-dimensional models are already available. Such supplements, however, are often expensive to manufacture, bulky and difficult to store, and—most important—represent only crude and exaggerated reproductions of the original object and thus fail to convey to the visually handicapped student sufficient and accurate information. Often, such supplements must be used in conjunction with long and complicated explanations in Braille text, or on tape which further add to the bulk of the supplement. However, even when such accompaniments are used, student comprehension is not significantly enhanced.

As used hereto, the expressions "high relief facsimile" and "raised line facsimile" are often used interchangeably to mean printed facsimiles of graphic prototypes bearing relief portions and/or raised lines.

As used herein the tem "graphic prototype" includes but is not limited to a photograph, photomicrograph, diagram, drawing, etc.

OBJECTS OF THE INVENTION

Accordingly, one object of the present invention is to simplify instruction and improve comprehension of vision impaired students.

Another object of the present invention is to simplify instruction and improve comprehension of vision impaired students in subjects in which braille text and/or audiotapes are inadequate, and/or complicated and inefficient, to provide a complete understanding of the subject matter.

Another object of the present invention is to provide a high-relief facsimile of a graphic illustration (or prototype) for use by vision impaired students and a method for making such a facsimile.

Another object of the present invention is to provide a raised line facsimile which is easy to store and use and inexpensive to manufacture using relatively widely available materials and which is a faithful reproduction of the prototype.

Still another object of the present invention is to provide a high-relief facsimile of a microscopic image and a method for making the same.

Yet another object of the present invention is to provide a teaching supplement employing a series of high-relief facsimiles accompanied by a relatively simple audiotape and/or braille text.

SUMMARY OF THE INVENTION

One aspect of the present invention relates to a method for making a raised line facsimile of a graphic prototype suitable for use by visually handicapped individuals in lieu of said prototype.

Another aspect of this invention relates to a raised line facsimile suitable for use by visually handicapped individuals prepared in a accordance with the above method.

A third aspect of this invention relates to an instruction supplement assembly for teaching visually handicapped students comprising a raised line facsimile as described in the preceding paragraph and an audiotape recording containing at least one of (a) instructions for use of said facsimile and (b) descriptive information pertaining thereto.

DETAILED DESCRIPTION OF THE INVENTION

The detailed description of the invention is given below with reference to particular preferred embodiments.

In accordance with one embodiment of the present invention, a photomicrograph is first made of a particular microscopic object, such as a cell, using preferably a high contrast film to eliminate many of the intermediate gray tones. Kodak[2] Contrast Process Pan High Contrast Copy Film (TM) is particularly preferred. Enlarged prints are made from the developed negatives preferably on hard or very hard grade resin coated paper, such as Kodak Kodabrome II R.C., to further eliminate gray tones.

[2] This and all products referred to herein using the trademark designation "Kodak" are produced by Eastman-Kodak, Inc., Rochester, N.Y.

At this stage, the prints may be retouched to further highlight desired features of the photomicrographed object. For example, if a raised-line print of a cell is desired for an introductory biology course, the instructor might wish to place emphasis on the cell nucleus and membrane and defer reference to, e.g., protoplasmic structures until later in the course. A simplified high relief facsimile of a cell photomicrograph may be prepared by "whiting out" the images of secondary subcellular structures at this stage in the facsimile preparation. A white drawing ink or typewriter correction fluid is suitable for this purpose.

The enlarged print, whether or not it has been retouched, as described above, is then copied onto litho film (Kodak Kodalith (TM) or Polychrome (TM)[3] is preferred) using a copy camera. The resulting litho film negative may be further enlarged or reduced, as appropriate, if the copy camera has such a capacity. Subsequently, a film positive is made from the litho film negative by contact exposure onto another frame of litho film of appropriate dimensions. The thus obtained litho film positive is then developed and examined to see if the desired features are adequately highlighted. If the images do not have sufficient clarity, contrast, etc., further retouching or further augmentation may be necessary. The photographic emulsion on selected portions of the film positive may be scraped clear to eliminate undesireable detail or to highlight certain features. Augmentation may be performed, if necessary, using the copy camera. When the image of a cell is involved, a typical modification at this stage involves "clearing" the image of the dense cytoplasm surrounding the nucleus so that the latter may be more easily identified by touching the final high-relief facsimile. At the end of this processing step, the litho film positive will be an exact (though two-dimensional) version of the finished high-relief facsimile.

[3]/Manufactured by the Polychrome Corporation, Blue Ash, Ohio.

In accordance with another embodiment of the present invention, a regular photograph may be used as a starting material in the preparation of a high-relief facsimile. The procedure is generally the same as above, although it will probably involve less or no initial enlargement. Generally, the amount of enlargement and retouching depend on the subject matter photographed, the amount of detail desired on the final high-relief or raised-line facsimile, and the purpose for which the facsimile is prepared, and are well within the skill of the art.

In accordance with a third embodiment of this invention, a black and white paper drawing may be used as a starting material in the preparation of a raised-line facsimile. The drawing may be photographed onto litho film or it may be copied onto a transparency using a standard photocopy machine capable of making copies on transparencies, such as a Minolta Model EP-520 (TM). It is also possible to enlarge such a drawing, if it is sufficiently "crisp", without a camera, using instead a photocopy machine having enlarging capabilities, such as a Canon 400 (TM) (which enlarges at increments of 27%). Multiple enlargements of clean, crisp, black-and-white drawings or diagrams are possible by this method without substantial loss of detail.

Finally, the initial drawing may be made on frosted acetate paper which can then be used for photostenciling directly, without any camera work.

Frames for the printing screens may be prepared using several materials normally used for silkscreening, such as aluminum roller frames, pressed wood frames (with tongue and wood corners), or wood frames with mitered corners and cord grooves.

Wood frames made with mitered corners which can be assembled using glue and corrugated fasteners are particularly preferred. They are equipped with surface grooves which permit fabric to be stretched over the frames and held taut with cotton cord forced into the grooves.

Suitable screen materials include but are not limited to monopolyester and multifilament polyester fabric, multifilament polyester being preferred. Metal screens may be used also, but are expensive. The fabric mesh count is important because it determines the degree of relief obtained on the final relief or raised-line facsimile as well as the resolution thereon. An open mesh favors relief but impairs resolution. A fine mesh produces crisp images but often of inadequate relief. Seventy-four to 140 mesh fabric is preferred, with 86 mesh fabric being particularly preferred.

Before stencil or emulsion are applied on a screen, the latter must be scrubbed with a solution containing an abrasive substance, such as Ulano[4]/ Microgrit (TM) powder, to roughen the fabric threads and improve adherence of the emulsion. The abrasive solution may be applied on the fabric with a small brush. Screen abrasion is necessary only prior to the first use of the fabric. After abrasion and before coating, the screen fabric is preferably treated with another suitable solvent to remove oils and grease. Ulano Degreaser (TM), a water based degreaser, is preferred for that purpose. Degreasing is recommended each time a new screen is applied.

[4]/This and all products referred to herein using the trademark designation "Ulano" are manufactured by Ulano Corporation, New York, N.Y.

A direct emulsion technique may be used to prepare the stencils. The screens are coated with a photosensitive emulsion, preferably a diazo-sensitized, water-resistant product such as Ulano TZ (TM). Multiple coats of mixed emulsion are applied to both sides of a cleaned screen using an appropriate applicator, such as a scoop coater. The layers are applied according to the "wet on wet method", i.e., each layer is applied on the screen before the previous layer has dried. Preferably, the applicator should be sufficiently wide to avoid overlap of emulsion coats in the center of the screen. All screen coating operations should of course be performed under a light that does not expose the emulsion.

The screens are dried in a darkroom, preferably with a fan, in order to set the emulsion quickly and thus prevent sags and runs. Dry coated screens may be stored under a dark opaque cover in a cool dry place for at least a month without experiencing loss in final facsimile quality. The screens are preferably prepared ahead of time for use as necessary.

After the litho film positives have been prepared, they are placed in contact with the unexposed coated screen or stencil. The film positive side is placed in front of a powerful light source such as a carbon-arc illumination system, a mercury vapor lamp, a pulsed xenon or metal halide lamp, or, in case of a litho film positive, a bank of 4-6 fluorescent tubes or a photoflood bulb. Exposure time and development time are mutually dependent and they also vary depending on light source intensity. Consequently, they are subject to optimization, which is well within the skill of the art.

After exposure, the screens are simply washed out using lukewarm water under mild pressure, by using, e.g., a garden hose spray nozzle. Emulsion coated areas protected by the dark regions of the positive film during exposure readily wash away leaving only the mesh work of the fabric. Washout must be sufficiently thorough to clear all such openings. A faithful negative image is thus obtained on the screen. Screens are then dried with a fan.

An alternative way to prepare printing screens is by an indirect stencil method using Ulano Poly Blue II or Ulano Hi Fi Green (TM) indirect photostencil films. Indirect stencils are in some ways more convenient to store and use than the liquid emulsions.

Stencils are exposed in contact with a film positive or like transparency before being placed on the stretched screen. The exposed stencil is then developed in a tray according to the manufacturers' instructions and then washed out as described in the case of direct emulsion coating. The wet film stencil is adhered to the fabric by laying the rinsed stencil film, sticky side up, on, e.g., a stack of newspapers. The screen is placed on the film and blotted. Use of a roller helps insure good contact of stencil and fabric. The screen is dried before a fan and then the acetate backing of the stencil film is peeled away making the stencil ready for printing.

By the above-described processes the light-exposed parts of the stencil film or coated emulsion, harden—the emulsion type immediately, the stencil type only after development. The parts of the stencil or emulsion that are protected from the light source by the opaque artwork or film positive remain soft and then can be washed away leaving openings defining a faithful negative replica which can be printed through the unobstructed fabric as will be described below.

Before printing, screens must undergo a final "dressing" with a suitable filler to block out any pinholes in the image area or near the screen edges which may have not received a complete coating of emulsion or film. The "dressing" is applied to the inside of the screen. Ulano Screen Filler #60 (TM) is preferred. When the block-out is dry, a strip of solvent-resistant tape may be placed over the edge seam, on the down side of the frame, and along the right angles of the printing side, to prevent ink from getting under the frame and to allow for easier screen cleanup.

Suitable printing inks should be readily polymerizable to yield a raised line or high relief. Preferably, such inks should polymerize under mild heating conditions (less than 200° C.) to create a raised-line or high-relief facsimile, but they should not dry up too quickly as this causes the screen to clog after a few prints. In addition, such inks should contain a sufficient amount of polymerizable material to create appreciable relief on the final facsimile surface, and should preferably be viscous.

Super Puff Ink (TM), made by the Union Ink Company, Ridgeway, N.J. is preferred. This petroleum base ink is very slow to dry which makes printing much easier. Preferably, it should be polymerized within a half hour of printing to avoid appearance of a solvent halo around the pigmented material. Polymerization, which ideally should take place immediately after printing, is preferably conducted in an oven at about 175°–185° C. for about 20–40 seconds. The texture of polymerized Super Puff ink feels very much like latex, which the vision impaired students, who tested this invention, found to be more desirable than the softer feel of other inks such as Paint Puffer Paint (TM), manufactured by Polymerics Corp., Waltham, Mass. Super Puff ink may be cleaned from the screen using mineral spirits or turpentine. If it is allowed to air dry, it polymerizes on the screen, rendering it very hard to reclaim.

Printing is preferably carried out on a vacuum table to hold the paper down, facilitate lighting of the screen, and prevent smearing. The flood coat technique is employed by which an appropriate quantity of ink is applied on the screen with the aid of a spreading tool, such as a squeegie having a hard rubber or a polyurethane blade. The screen is then removed and the print is heated to polymerize the ink, as described above.

The facsimilies of the present invention are preferably used by vision impaired students in conjunction with Braille text and/or audio cassettes and are meant to supplement and simplify such text and cassettes by directly conveying to the student a certain concept, or shape, necessary for his complete understanding of the course subject matter which may be difficult or impossible to describe in words.

EXAMPLE

Photomicrographs were made of a prepared slide and a fresh wet mount of animal cells using a Wild M2 light microscope equipped with a 4"×5" sheet film holder on a 35 mm camera back and Kodak Process Pan-High Contrast Copy Film. The negatives were enlarged using a Durst Laboratory Model 138S enlarger and 8"×10" prints were made on Kodak Kodabrome II R.C. paper. The enlarged negatives were retouched with typewriter correction fluid to highlight indistinct portions of the subject matter, such as membranes. The prints were copied using 8"×10" litho Kodak Kodalith (TM) film in a copy camera that allowed for enlarging or reducing the image, as required. Positives were then made from the large format negatives by contact exposure, again onto litho film. Where further size changes were necessary, the 8"×10" negatives were rephotographed with the copy camera, making size adjustments. The litho film sheet positives were developed in a two-step process according to the film manufacturer's directions and the developed litho film positives, were checked for image clarity, contrast and augmentation. Where the dense cytoplasm around a cell nucleus was too prominently displayed, further enlargements and/or retouching was performed to make the nucleus more easily identifiable.

Screen frames were made from 16" and 20" miter sticks (1⅝" width) having a routed grove on their surface. The frames were assembled with glue and corrugated fasteners. Fabric, 86 mesh multifilament polyester, was stretched across the frames by forcing cotton cord into the routed grooves on the frame surface to make screens. Frame surfaces were covered with solvent- and water-resistant tape. Tape was also placed around the inside of the frames where fabric and wood meet.

The thus prepared screens were scrubbed once with Ulano Microgrit using a smalll brush to roughen the fabric surface. The scrubbed screens were then treated with Ulano Degreaser solvent to remove oils and grease.

A multiple coat of mixed diazo-sensitized water resistent emulsion (Ulano TZ) was applied under yellow light to each side of each cleaned screen with a scoop coater almost as wide as the shorter dimension of the screen. Each coat was applied before the previous one had dried (wet-on-wet). The coated screens were dried in the darkroom in front of a fan.

The litho film positives were placed in direct contact with the dried coated stencils. The positive side was placed in front of the carbon-arc illumination system of a Nu-Arc (TM) plate maker for 3.5 seconds. After exposure, the screens were thoroughly washed using lukewarm water with a garden hose spray nozzle to wash away unexposed emulsion. The screens were again dried with a fan.

The thus prepared screens were "dressed" with Ulano Screen Filler No. 60 on the inside to block out any pinholes and again fan dried. A strip of solvent resistant tape was placed over the edge seam on the down side of the frame and along the uprights of the printing side. A 30"×30" vacuum frame was used for printing. The frame was made as follows: grooves were routed on a piece of ¾ plywood to make a checkerboard pattern of channels (¼" wide, ¼" deep). The grid pattern was joined by two diagonal grooves. Formica was laminated to the grooved plywood surface and a 1/32" hole was drilled at the center of each groove intersection and a ¾" hole was drilled at the center of the checkerboard pattern. Standard ¾" plastic plumbing fixtures were used to cover the center hole and link the routed channels to a small shop vacuum.

For printing, paper was placed on the vacuum table and covered with the screen. Super Puff Ink (Union Ink Co.) was applied on the top side of the screen with a squeegie with a hard rubber blade. The ink passed down onto the printing paper and the screens were lifted while the vacuum held the printed paper down. The printing ink was poymerized in a 175° C. oven for 30-40 seconds to yield a three-dimensional raised line print. The screens were cleaned with turpentine.

Using the high-relief facsimiles prepared as described above, nine laboratory supplements were prepared to be used as supplements in the instruction of biology to visually impaired secondary school and college students. The supplements included the high-relief facsimiles as a central component accompanied by a short audiotape as an analog to a laboratory manual. In addition, the students had access to a braille biology text.

The supplements covered the following topics: Microscopy; Plant and Animal Cells; Mitosis; Protozoans, Algae; Fungi; Leaf Structure, Stem Structure and Root Structure.

What is claimed is:

1. A method for making a raised line facsimile of a photographic image, said facsimile being suitable for use by visually handicapped individuals in lieu of said photographic image to enable said individuals to acquire an understanding of the subject matter of said photographic image, said method comprising:
   (a) providing a positive copy of said photographic image on a transparent substrate, said copy being of sufficient size, detail, contrast and quality to yield a raised line facsimile, said facsimile having tactilely distinguishable raised and lowered portions, and being capable of conveying accurate information about the subject matter of said photographic image to said individuals;
   (b) preparing a faithful negative reproduction of said image from said positive copy on a silkscreen;
   (c) printing a positive facsimile of said image using said screen and a polymerizable printing ink; and
   (d) treating said positive facsimile under conditions sufficient to polymerize said ink, and create said raised line facsimile.

2. The method of claim 1 wherein the positive copy of said prototype has been sufficiently enlarged prior to preparation of the silk screen so as to yield a raised line facsimile having tactilely distinguishable raised and lowered portions.

3. The method of claim 2 wherein said positive copy has been retouched to produce a raised line facsimile reproducing selected features of said photographic image.

4. The method of claim 2 wherein said positive copy has been retouched to produce a raised line facsimile reproducing selected features of said photographic image with increased contrast.

5. The method of claim 1 wherein said positive copy has been produced photographically using at least one of high contrast film, high contrast photographic paper and litho film.

6. The method of claim 1 wherein said silk screen negative reproduction is prepared by direct coating said silk screen with a photosensitive emulsion followed by exposing said screen in contact with said positive copy to a source of light, thereby exposing selected portions of said emulsion, washing off the unexposed emulsion, and drying said screen.

7. The method of claim 1 wherein said silk-screen is prepared by an indirect stencil method comprising exposing a stencil film in contact with said positive copy to create a negative of said positive copy on said stencil film, developing said stencil film, contacting said developed film with said screen so that the exposed portions thereof adhere on said screen, and removing the unexposed portions of said film.

8. The method of claim 1 wherein said screen is made of a wood frame and multifilament polyester fabric stretched on said frame.

9. The method of any one of claims 1, 2-5 and 6-8 wherein the subject matter of said photographic image is such that a clear understanding of it cannot be supplied to visually handicapped individuals by a description thereof.

10. The method of any one of claims 2-5 and 6-8 wherein said photographic image is a photomicrograph.

* * * * *